US012656440B2

(12) United States Patent (10) Patent No.: US 12,656,440 B2
Ludwig et al. (45) Date of Patent: Jun. 16, 2026

(54) METHOD AND DEVICE FOR MONITORING PHASE CURRENT SENSORS

(71) Applicant: Bayerische Motoren Werke Aktiengesellschaft, Munich (DE)

(72) Inventors: Stefan Ludwig, Munich (DE); Christoph Sudan, Eurasburg (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 167 days.

(21) Appl. No.: 18/613,278

(22) Filed: Mar. 22, 2024

(65) Prior Publication Data

US 2024/0319305 A1 Sep. 26, 2024

(30) Foreign Application Priority Data

Mar. 23, 2023 (DE) ..................... 10 2023 107 259.5

(51) Int. Cl.
*G01R 35/00* (2006.01)
*G01R 25/00* (2006.01)
(52) U.S. Cl.
CPC ............. *G01R 35/00* (2013.01); *G01R 25/00* (2013.01)
(58) Field of Classification Search
CPC .... G01R 35/00; G01R 25/00; G01R 19/0092; G01R 31/343; G01R 31/42
USPC .................................. 324/74.11, 76.52, 76.33
See application file for complete search history.

(56) References Cited

U.S. PATENT DOCUMENTS 10,418,922 B1 * 9/2019 Bosteels ............... G01R 35/005
12,105,176 B2 * 10/2024 Chao ........................ G01R 35/00

2010/0295492 A1 11/2010 Chakrabarti et al.
2012/0101672 A1 4/2012 Wang et al.
2021/0132122 A1 * 5/2021 Narayanasamy ....... H02P 29/40
2022/0214406 A1 * 7/2022 Rudloff ................... H02M 1/36
2022/0381806 A1 * 12/2022 Ruppert ............ H02M 7/53873
2023/0366968 A1 * 11/2023 Secrest ................... H02P 23/14

FOREIGN PATENT DOCUMENTS

DE 10 2010 028 097 A1 1/2011
DE 10 2011 116 296 A1 4/2012
DE 10 2017 222 420 A1 6/2019

OTHER PUBLICATIONS

German-language Search Report issued in German Application No. 10 2023 107 259.5 dated Dec. 4, 2023 with partial English translation (10 pages).

* cited by examiner

*Primary Examiner* — Giovanni Astacio-Oquendo
(74) *Attorney, Agent, or Firm* — Crowell & Moring LLP

(57) ABSTRACT

A device for checking K phase current sensors for capturing measured values of K corresponding phase currents of an N-phase, electrical load, in particular an electrical machine, with N≥3 and with K<N, is provided. The device is configured to cause the N-phase load to be operated for a test period in a test operating mode in which the sum of the K phase currents, which are captured by the K corresponding phase current sensors, corresponds to a predefined value, in particular zero. Furthermore, the device is configured to determine K measured values from the K corresponding phase current sensors during the test period, and to check at least one of the K phase current sensors on the basis of the K measured values.

18 Claims, 2 Drawing Sheets

200

Cause a test operating mode of the electrical machine

201

Determine K measured values using K current sensors

202

Check the current sensors on the basis of the measured values

203

METHOD AND DEVICE FOR MONITORING PHASE CURRENT SENSORS

CROSS REFERENCE TO RELATED APPLICATION

This application claims priority under 35 U.S.C. § 119 from German Patent Application No. 10 2023 107 259.5, filed Mar. 23, 2023, the entire disclosure of which is herein expressly incorporated by reference.

BACKGROUND AND SUMMARY

The invention relates to a method and a corresponding device which are geared to phase current sensors of an electrical load, in particular an electrical machine, which is operated with a multi-phase current.

An electrically driven vehicle has an electrical drive machine that can be operated with multiple, generally N, for example N=3, phase currents. The phase currents can be generated by a converter on the basis of a direct current provided by an electrical energy store. The individual phase currents can each be captured and monitored by a current sensor which is arranged on the respective phase line. The measured values from K current sensors can be used to control the phase currents, with K<N, in particular K=2. The $N^{th}$ current sensor or the N–K current sensors can be used to check the plausibility of a summation current.

Using N current sensors for the N phase currents of an electrical drive machine makes it possible to reliably meet requirements with regard to the functional safety of the vehicle's drive (e.g. ASIL D, Automotive Safety Integrity Level according to ISO 26262). On the other hand, the provision of the additional $N^{th}$ current sensor is associated with additional costs, weight and installation space.

The present document deals with the technical object of enabling particularly efficient and reliable monitoring of the phase currents of a multi-phase electrical load, in particular an electrical machine.

The object is achieved by the claimed invention. It is pointed out that additional features of a patent claim dependent on an independent patent claim, without the features of the independent patent claim or in combination only with a subset of the features of the independent patent claim, may form a standalone invention that is independent of the combination of all of the features of the independent patent claim and may be made into the subject matter of an independent claim, a divisional application or a subsequent application. This applies in the same way to technical teachings that are described in the description and may form an invention independent of the features of the independent patent claims.

One aspect describes a device for checking K phase current sensors for capturing measured values of K corresponding phase currents (for K corresponding phases) of an N-phase, electrical load, in particular an electrical machine, with N≥3 (in particular N=3) and with K<N, in particular K=2. The phase currents can be generated using a converter or inverter on the basis of a direct current. The device may be designed to control the phase currents on the basis of the measured values from the K phase current sensors (e.g. in order to adjust the torque of the electrical machine). The phase currents can be controlled during standard operation of the electrical load, in particular the electrical machine.

The device is configured to cause the N-phase load to be operated in a test operating mode for a test period. The test period can be between 100 ms and 1 second, for example. If necessary, a test period of 100 ms or less, or 10 ms or less, in particular 1 ms or less, can be made possible (especially if the test operating mode is integrated in standard operation). The test operating mode can be integrated in standard operation. In particular, a test operating mode can be introduced into standard operation, if necessary repeatedly, in particular periodically (in order to check one or more of the K phase current sensors). The device may thus be configured to cause the N-phase load to be operated in the test operating mode repeatedly, in particular periodically, during (standard) operation, in order to repeatedly check at least one of the K phase current sensors. This allows permanently reliable current control to be achieved.

The test operating mode can be designed such that the sum of the K phase currents, which are captured with the K corresponding phase current sensors, corresponds to a predefined (sum) value, in particular zero. Furthermore, the individual K phase currents can each be unequal to zero (while the other N–K phase currents are equal to zero). For example, for N=3 and for K=2, the first phase current of the first phase may correspond to the second phase current of the second phase in terms of absolute value (but with an opposite sign).

The device may also be configured to cause the $N^{th}$ phase current of the $N^{th}$ (e.g. the third) phase to be zero in order to operate the N-phase load in the test operating mode (with N=3 and K=2). If necessary, there may be no phase current sensor for the $N^{th}$ phase. This enables particularly efficient current monitoring, in particular current control, to be achieved.

The device is configured to determine K measured values from the K corresponding phase current sensors during the test period. The sum of the K measured values should correspond to the predefined (sum) value if none of the phase current sensors is impaired.

The device may be configured to check at least one of the K phase current sensors on the basis of the K measured values. In particular, it can be checked whether or not the sum of the K measured values corresponds to the predefined value. If this is not the case, this may indicate an impairment of at least one of the K phase current sensors. This enables efficient and reliable monitoring of the phase current sensors.

The device may be configured to determine a target value for the measured value from the remaining phase current sensor from the K phase current sensors based on K–1 measured values from K–1 of the K phase current sensors and taking into account the predefined (sum) value. For example, for N=3 and for K=2, the first measured value from the first phase current sensor (with reversed sign if necessary) can be used as the target value for the second measured value from the second phase current sensor.

The remaining phase current sensor (from the K phase current sensors), in particular the measurement gain of the remaining phase current sensor, can be checked by comparing the measured value from the remaining phase current sensor with the target value. This makes it possible to check at least one phase current sensor in a particularly reliable manner.

As already explained further above, the $N^{th}$ phase current of the $N^{th}$ phase during the test operating mode is preferably zero (for N=3 and K=2). In particular, the remaining N–K phase currents of the remaining N–K phases may be zero during the test operating mode. The device may be configured (during standard operation of the load) to determine a zero crossing time for a zero crossing of the $N^{th}$ phase current of the $N^{th}$ phase (or of one or more, for example all, of the N–K phase currents). In other words, it is possible to determine a time during standard operation, at which the $N^{th}$ phase (or one or more, for example all, of the N–K phases) has a zero crossing. It is then possible to cause the $N^{th}$ phase current (or the N–K phase currents) to be zero at the zero crossing time for the test period in order to operate the N-phase load in the test operating mode. This can be achieved by operating the N–K half bridges of the inverter for the corresponding N–K phases (in particular for the $N^{th}$ phase) (e.g. by opening the high-side switching element and the low-side switching element of the individual half bridges). This allows the test operating mode to be integrated in standard operation of the electrical load in a particularly efficient and discreet manner.

As already explained further above, the phase currents are typically generated by a converter, wherein the converter has N switching bridges, in particular half bridges, for generating the N phase currents for the N phases. The switching bridges of the converter each generate phase voltages for the different phases, from which the N phase currents result (typically by way of a control mechanism). The switching bridges can each have a high-side switching element (for coupling to a high-side potential) and a low-side switching element (for coupling to a low-side potential). The switching elements of a switching bridge are typically not closed at the same time.

The device may be configured to control the N switching bridges according to a respective test switching pattern (with PWM pulses) in order to operate the N-phase load in the test operating mode. Dedicated test switching patterns can therefore be provided for the test operating mode (which differ from the switching patterns of the standard operating mode). This makes it possible to provide a particularly robust test operating mode.

The device may be configured (for the case N=3 and K=2), during the test period, to cause the $N^{th}$ switching bridge for the $N^{th}$ phase to set the $N^{th}$ phase current of the $N^{th}$ phase to zero. This can be done, for example, by opening the switching elements (in particular the high-side switching element and the low-side switching element) of the $N^{th}$ switching bridge. For general N and K, it is possible to cause the remaining N–K phase currents of the remaining N–K phases to be set to zero by the corresponding switching bridges of the converter. For this purpose, the switching elements of the N–K converters can be opened.

The device may also be configured to cause the K switching bridges for the K phases with the K corresponding phase current sensors to generate K phase currents which together result in the predefined (sum) value. This can be achieved for N=3 and K=2 in particular by the fact that, during the test period, the low-side switching element of the second switching bridge for the second phase is closed, while the high-side switching element of the first switching bridge for the first phase is closed, and/or the high-side switching element of the second switching bridge for the second phase is closed, while the low-side switching element of the first switching bridge for the first phase is closed. This makes it possible to achieve complementary operation of the switching bridges for the first and second phase. This allows the test operating mode to be provided in a particularly efficient and robust manner.

Alternatively or additionally, the device (for N=3 and K=2) may be configured to effect a first phase current for the first phase during the test period using the first switching bridge. The first phase current may alternately have positive and negative sections in which the first phase current is positive or negative. The second half bridge can be operated depending on the polarity of the first phase current. In particular, the low-side switching element of the second half bridge can be closed in a positive section of the first phase current (while the high-side switching element of the second half bridge is open). Furthermore, the high-side switching element of the second half bridge can be closed in a negative section of the first phase current (while the low-side switching element of the second half bridge is open).

In other words, the device may be configured to close the low-side switching element of the second switching bridge for the second phase during the test period, while the first phase current for the first phase is positive, and/or to close the high-side switching element of the second switching bridge for the second phase, while the first phase current for the first phase is negative. This allows the test operating mode to be provided in a particularly efficient and robust manner.

The device may be configured to cause the current-time area (i.e. the product of current intensity times time) with a positive current to be equal to the current-time area with a negative current during the test period. This allows a particularly gentle test operating mode to be achieved. In particular, it is possible to cause the electrical load, in particular the electrical machine, to effectively generate no torque during the test operating mode.

The device may be configured to deactivate the N switching bridges during a measurement period which differs, in particular, from the test period (e.g. by opening the high-side and low-side switching elements of the N switching bridges). K further measured values from the K phase current sensors can be captured during the measurement period. Furthermore, at least one (in particular all) of the K phase current sensors, in particular the measurement offset of the phase current sensor or the phase current sensors, can be checked on the basis of the K further measured values. Integrating a further measurement period in standard operation of the load makes it possible to further increase the quality of the monitoring of the phase current sensors.

The device may be configured (for N=3 and K=2) to determine a first zero crossing time for a zero crossing of a first of the K phase currents, and to cause the first phase current to be zero at the first zero crossing time for the measurement period (e.g. by opening the low-side and high-side switching element of the switching bridge for the first phase). Furthermore, a first measured value can be captured during the measurement period using the first phase current sensor of the K phase current sensors. Furthermore, the first phase current sensor, in particular the measurement offset of the first phase current sensor, can be checked on the basis of the first measured value. The monitoring of the phase current sensors can thus be further improved.

Another aspect describes a (road) motor vehicle (in particular a passenger vehicle or a commercial vehicle or a bus or a motorcycle) that comprises the device described in this document. The vehicle also comprises an electrical drive machine and a converter for generating phase currents for operating the drive machine. The device is configured to check the phase current sensors for K of the phase currents.

Another aspect describes a method for checking K phase current sensors for capturing measured values of K corresponding phase currents of an N-phase, electrical load, in particular an electrical machine, with N≥3, in particular N=3, and with K<N, in particular K=2. The method comprises causing the N-phase load to be operated for a test period in a test operating mode in which the sum of the K phase currents, which are captured by the K corresponding phase current sensors, corresponds to a predefined (sum)

value, in particular zero (during the entire test period). Furthermore, the method comprises determining K measured values from the K corresponding phase current sensors during the test period, and checking at least one of the K phase current sensors on the basis of the K measured values.

Another aspect describes a software (SW) program. The SW program may be configured to be executed on a processor (for example on a controller of a vehicle) and thereby to carry out the method described in this document.

Another aspect describes a storage medium. The storage medium may comprise an SW program that is configured to be executed on a processor and thereby to carry out the method described in this document.

It should be noted that the methods, devices and systems described in this document may be used both on their own and in combination with other methods, devices and systems described in this document. Furthermore, any aspects of the methods, devices and systems described in this document may be combined with one another in a wide variety of ways. The features of the claims may in particular be combined with one another in a wide variety of ways. Furthermore, features in parentheses are to be understood as optional features.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1A:
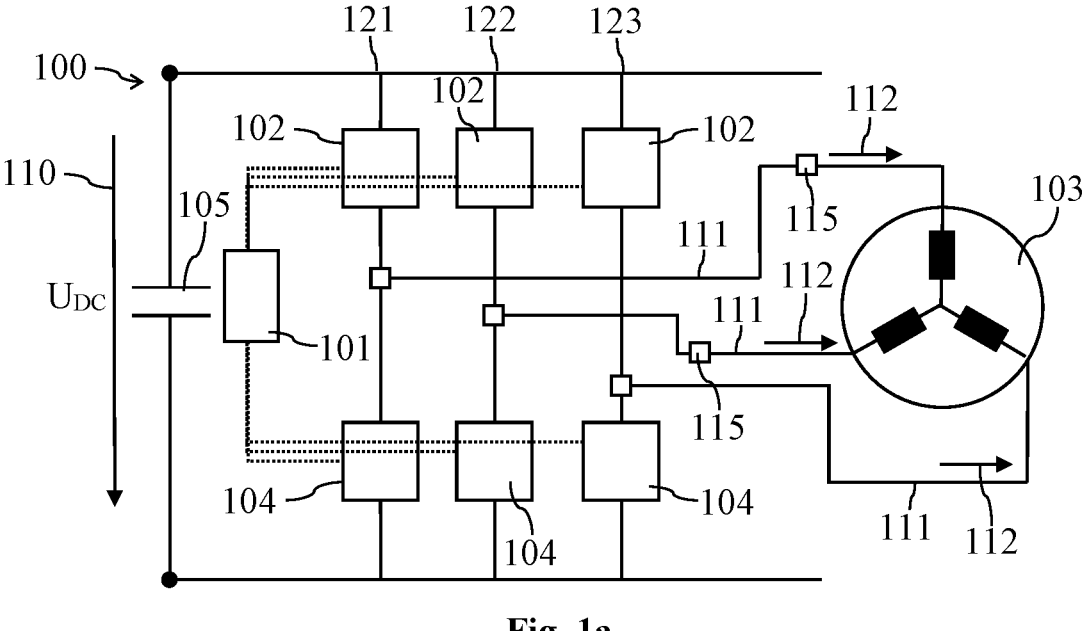
FIG. 1a shows an exemplary inverter or converter for an electrical machine of a vehicle.

As explained at the outset, the present document deals with the efficient and reliable monitoring of the phase current sensors of an electrical load. In this context, FIG. 1a shows an exemplary inverter 100 which is configured to generate phase voltages 111 (i.e. AC voltages) for the coils of an electrical machine 103 (e.g. a vehicle) on the basis of an electrical system voltage $U_{DC}$ 110 (i.e. a DC voltage). The inverter 100 can have a DC link with a DC link capacitor 105, to which the electrical system voltage $U_{DC}$ 110 is applied.

The inverter 100 (or converter) comprises multiple switches or switching elements 102, 104 which are each arranged in a half bridge for each phase 121, 122, 123 in the example shown. The switching elements 102, 104 are controlled by a control device 101 to generate the phase voltages 111 for the electrical machine 103.

Figure 1B:
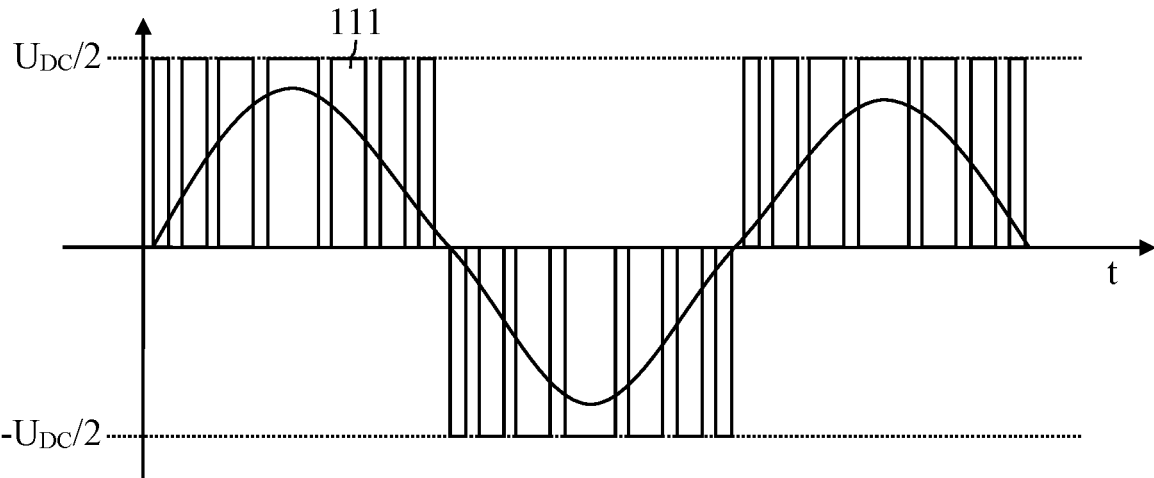
FIG. 1b shows an exemplary profile of a phase voltage.

FIG. 1b shows an exemplary phase voltage 111 which can be generated by the switching elements 102, 104 of a half bridge. As can be seen from FIG. 1b, the switching elements 102, 104 are switched with a certain pulse pattern (i.e. opened or closed) in order to generate a (sinusoidal) AC voltage 111. The pulse pattern for a certain (static) operating point of the electrical machine 103 can be determined in advance, e.g. by way of an optimization method such as SOPWM (Synchronous Optimal Pulse Width Modulation), which can be used to optimize, in particular minimize, a certain optimization criterion (e.g. the harmonic distortion of the phase currents). The determined pulse patterns for different operating points of the electrical machine 103 can be stored, e.g. in a look-up table (LUT). The individual pulse patterns each have a certain number M of pulses for each wave or half-wave of the AC voltage to be generated, where M is an integer (e.g. M=1, 2, 3, 4, 5, 6 or more).

The different operating points of the electrical machine 103 can include, for example, different torques to be set and/or different speeds.

The device 101 may be configured to control the current, in particular to control the phase currents 112 for the different phases 121, 122, 123 of the electrical machine 103, in order to set a certain operating point of the electrical machine 103. For this purpose, measured values for the phase currents 112 in the different phases 121, 122 can be captured using current sensors 115. It is typically sufficient, in the case of N different phases 121, 122, 123 (e.g. N=3), to capture measured values for K phases (K<N, in particular K=2), since the phase current 112 on the $N^{th}$ phase 123 (or on the remaining N–K phases 123) results as a summation current from the other K phases 121, 122 (e.g. as zero). The inverter 100 therefore advantageously has only K current sensors 115 for K corresponding phase currents 112.

The omission of a dedicated current sensor 115 for $N^{th}$ phase 123 (generally for the N–K phases 123) is advantageous in terms of costs, weight and/or installation space. On the other hand, the additional $N^{th}$ current sensor 115 (in general, the additional N–K current sensors 115) is now no longer available for checking the plausibility of the measured values from the other current sensors 115.

In this document, the $N^{th}$ phase 123 and the $N^{th}$ phase current 112 are discussed with reference to the case N=3 and K=2. It is pointed out that, for the general case of N and K<N, these features are applicable to the remaining N–K phases 123 and the remaining N–K phase currents 112.

The device 101 may be configured to effect a test operating mode of the electrical machine 103 (generally of the electrical load) (within the framework of standard operation of the electrical machine 103). The test operating mode can be designed such that a target value for the measured value from the remaining $(K)^{th}$ current sensor 115 (at the specific measurement time) can be determined from the measured values from K–1 current sensors 115, which are captured at a certain measurement time, for example. The remaining $(K)^{th}$ current sensor 115 can then be checked in an efficient and reliable manner by comparing the target value with the measured value from the $(K)^{th}$ current sensor 115.

The test operating mode may be designed such that the phase current 112 for the $N^{th}$ phase 123 (which does not have a current sensor 115) is zero. This can be achieved by the fact that the switching elements 102, 104 (in particular the high-side switching element 102 and the low-side switching element 104) for the $N^{th}$ phase 123 are open.

Alternatively or additionally, the test operating mode may be designed such that the phase current 112 of the $(K)^{th}$ phase 122 corresponds to the sum of the phase currents 112 of one or more (i.e. the K–1) other phases 121. In this case, the target value for the phase current 112 of $(K)^{th}$ phase 122 can be determined as the sum of the phase currents 112 of one or more (i.e. the K–1) other phases 121. This can be achieved, for example in the case of N=3, by virtue of the fact that the switching elements 102, 104 of the first phase 121 are opened or closed according to a certain switching pattern, and the switching elements 102, 104 of the second phase 122 are opened or closed with a complementary switching pattern, with the result that, if the high-side switching element 102 of the first phase 121 is closed, the low-side switching element 104 of the second phase 122 is closed; and/or, if the low-side switching element 104 of the first phase 121 is closed, the high-side switching element 102 of the second phase 122 is closed.

As already explained further above, two current sensors 115 are sufficient to control the phase currents 112 of a three-phase electrical machine 103 (with N=3). The plausibility of the gain (i.e. the measurement gain) and/or the offset of the two sensors 115 can be checked against each other, by way of a control or switching pattern of the converter 100 for the two half bridges or phases 121, 122 with the two current sensors 115, without the rotor position of the rotor of the electrical machine 103 having to be known for this.

The control pattern of the converter 100 (for providing the test operating mode) can have the following features. The half bridge or phase 123 without a current sensor 115 remains switched off; the half bridge or phase 121 of the first current sensor 115 adjusts, via the first current sensor 115, a first phase current 112 with a certain current value; and/or the half bridge or phase 121 of the second current sensor 115 switches on the low-side switching element 104 for positive first phase currents 112 and switches on the high-side switching element 102 for negative first phase currents 112.

The plausibility of the gains or the measurement gain values of the two sensors 115 can then be checked against each other by way of one or more measured values from the first and the second current sensor 115.

During the test operating mode, the current-time area with a positive and negative current can be small and/or the same in each case. This means that no effective torque is generated by the electrical machine 103 during the test operating mode.

In a further switching state, all half bridges or phases 121, 122, 123 can be switched off. This allows the plausibility of the offset of the current sensors 115 to be checked.

In an alternative or additional test operating mode (e.g. at a speed of the electrical machine 103 of more than 50 rpm), it is possible for the unmeasured phase 123 (i.e. the phase 123 without a current sensor 115) to not be activated in each case for one or more PWM pulses before and/or after the zero crossing of the phase current 112 of the phase 123 (and, for example, for both switching elements 102, 104 to be opened). Thus, the gain of the two sensors 115 on the other phases 121, 122 can be tested against each other (as described further above).

If necessary, for the individual phases 121, 122 with a current sensor 115, it may also be possible for the respective phase 121, 122 to not be activated in each case for one or more PWM pulses before and/or after the zero crossing of the phase current 112 of the respective phase 121, 122 (and, for example, for both switching elements 102, 104 of the respective phase 121, 122 to be opened). This allows the offset of the current sensor 115 of the respective phase 121, 122 to be determined and/or checked.

The electrical machine 103 can be operated in the test operating mode (during standard operation) repeatedly, in particular periodically (approximately every 100 ms), in order to check the current sensors 115 of the inverter 100. The repetition rate can be kept so low that the current control of the electrical machine 103 is not or hardly affected, and a reliable check of the current sensors 115 is possible.

Figure 2:
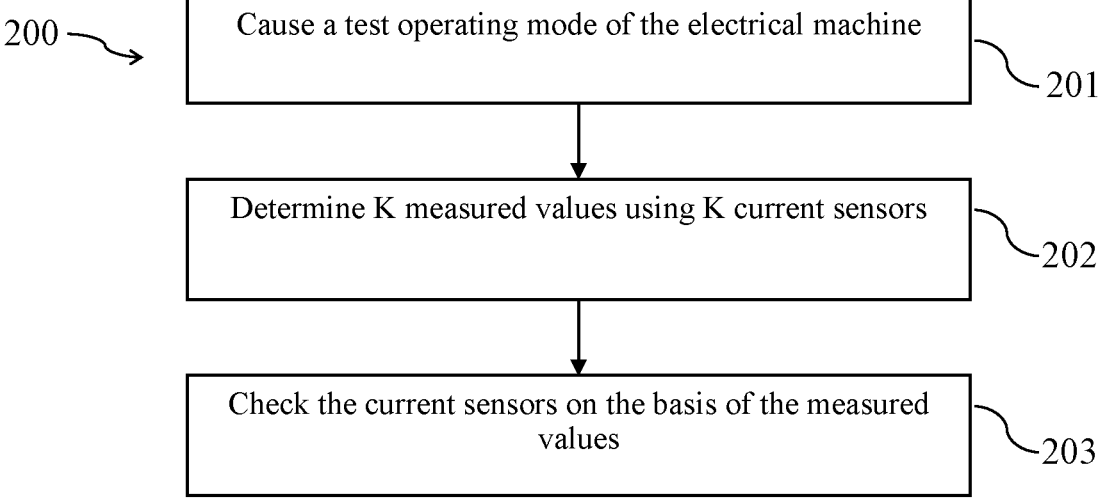
FIG. 2 shows a flowchart of an exemplary method for monitoring phase current sensors.

FIG. 2 shows a flowchart of a (possibly computer-implemented) method 200 for checking K phase current sensors 115 for capturing measured values of K corresponding phase currents 112 of an N-phase, electrical load 103, in particular an electrical machine, with N≥3. The N phase currents 112 for the N phases 121, 122, 123 of the load 103 can be generated by a converter 100. K phase current sensors 115 can be provided in order to capture K corresponding phase currents 112. A phase current sensor 115 may not be available for the $N^{th}$ phase current 112 and/or on the phase line of the $N^{th}$ phase 123.

The method 200 comprises causing 201 the N-phase load 103 to be operated in a test operating mode (during standard operation) for a test period (e.g. of 1 second or less, or 500 ms or less). In the test operating mode, the sum of the K phase currents 112, which are captured by the K corresponding phase current sensors 115, can correspond to a predefined (sum) value, in particular zero. In particular, for an N=3 phase load, it is possible to cause the first phase current 112 of the first phase 121 to correspond to the second phase current 112 of the second phase 122 in terms of absolute value (but with an opposite sign).

The method 400 further comprises determining 202 K measured values from the K corresponding phase current sensors 115 during the test period. In particular, a first measured value for the first phase current 112 and a second measured value for the second phase current 112 can be captured in the case of N=3.

Furthermore, the method 400 comprises checking 203 at least one of the K phase current sensors 115 on the basis of the K measured values. In particular, the gain (i.e. the measurement gain) and/or the measurement offset of the respective phase current sensor 115 can be checked.

In particular, based on the K measured values, it can be recognized that at least one of the K phase current sensors 115 has an impairment (e.g. because the sum of the K measured values does not correspond to the predefined (sum) value). If it is recognized that at least one of the K phase current sensors 115 has an impairment, a safety measure can be effected. Exemplary safety measures are: the output of a notice to the user of the load 103 and/or the deactivation or restriction, such as the throttling, of the load 103.

The measures described in this document enable a particularly efficient and reliable check of the phase current sensors of a multi-phase load, in particular an electrical machine 103.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A device for checking K phase current sensors for capturing measured values of K corresponding phase currents of an N-phase, electrical load with N≥3 and with K<N, wherein the device is configured:

to cause the N-phase load to be operated for a test period in a test operating mode in which a sum of the K phase currents, which are captured by the K corresponding phase current sensors, corresponds to a predefined value;

to determine K measured values from the K corresponding phase current sensors during the test period; and to check at least one of the K phase current sensors based on the K measured values.

2. The device according to claim 1, wherein the device is further configured:

to determine a target for the measured value from the remaining phase current sensor from the K phase current sensors based on K−1 measured values from K–1 of the K phase current sensors and taking into account the predefined value; and to check a measurement gain of the remaining phase current sensor by comparing the measured value from the remaining phase current sensor with the target.

3. The device according to claim 1, wherein the device is further configured to cause the $N^{th}$ phase current of the $N^{th}$ phase to be zero, for N=3 and K=2, in order to operate the N-phase load in the test operating mode.

4. The device according to claim 1, wherein the device is further configured, for N=3 and K=2:

to determine a zero crossing time for a zero crossing of the $N^{th}$ phase current of the $N^{th}$ phase; and to cause the $N^{th}$ phase current to be zero at the zero crossing time for the test period in order to operate the N-phase load in the test operating mode.

5. The device according to claim 1, wherein:

the phase currents are generated by a converter;

the converter has N switching bridges for generating N phase currents for the N phases; and the device is further configured to control the N switching bridges according to a respective test switching pattern in order to operate the N-phase load in the test operating mode.

6. The device according to claim 5, wherein the device is further configured, for N=3 and K=2, during the test period, to cause the $N^{th}$ switching bridge for the $N^{th}$ phase to set the $N^{th}$ phase current of the $N^{th}$ phase to zero; and to cause the K switching bridges for the K phases with the K corresponding phase current sensors to generate K phase currents which together result in the predefined value.

7. The device according to claim 5, wherein N=3 and K=2, and wherein the device is further configured, during the test period:

to close a low-side switching element of the second switching bridge for the second phase, while the first phase current for the first phase is positive; and/or to close a high-side switching element of the second switching bridge for the second phase, while the first phase current for the first phase is negative.

8. The device according to claim 5, wherein the device is further configured:

to deactivate the N switching bridges during a measurement period which differs from the test period;

to capture K further measured values from the K phase current sensors during the measurement period; and to check a measurement offset of the at least one of the K phase current sensors based on the K further measured values.

9. The device according to claim 1, wherein the device is further configured to cause a current-time area with a positive current to be equal to a current-time area with a negative current during the test period.

10. The device according to claim 1, wherein the device is further configured:

to determine a first zero crossing time for a zero crossing of a first of the K phase currents;

to cause the first phase current to be zero at the first zero crossing time for a measurement period;

to capture a first measured value using a first phase current sensor of the K phase current sensors during the measurement period; and to check a measurement offset of the first phase current sensor based on the first measured value.

11. The device according to claim 1, wherein the device is further configured to cause the N-phase load to be operated in the test operating mode repeatedly during operation, in order to repeatedly check at least one of the K phase current sensors.

12. The device according to claim 1, wherein the electrical load is an electrical machine.

13. The device according to claim 1, wherein K=2.

14. The device according to claim 1, wherein the predefined value is zero.

15. A method for checking, by a device, K phase current sensors for capturing measured values of K corresponding phase currents of an N-phase, electrical load with N≥3 and with K<N, the method comprising:

causing the N-phase load to be operated for a test period in a test operating mode in which a sum of the K phase currents, which are captured by the K corresponding phase current sensors, corresponds to a predefined value;

determining K measured values from the K corresponding phase current sensors during the test period; and checking at least one of the K phase current sensors based on the K measured values.

16. The method according to claim 15, wherein the electrical load is an electrical machine.

17. The method according to claim 15, wherein K=2.

18. The method according to claim 15, wherein the predefined value is zero.

* * * * *